US010885247B2

(12) United States Patent
Schkufza et al.

(10) Patent No.: US 10,885,247 B2
(45) Date of Patent: Jan. 5, 2021

(54) JUST-IN-TIME HARDWARE FOR FIELD PROGRAMMABLE GATE ARRAYS

(71) Applicant: VMware, Inc., Palo Alto, CA (US)

(72) Inventors: Eric Schkufza, Oakland, CA (US); Michael Wei, Palo Alto, CA (US)

(73) Assignee: VMware, Inc., Palo Alto, CA (US)

(*) Notice: Subject to any disclaimer, the term of this patent is extended or adjusted under 35 U.S.C. 154(b) by 434 days.

(21) Appl. No.: 15/881,654

(22) Filed: Jan. 26, 2018

(65) Prior Publication Data

US 2019/0236229 A1 Aug. 1, 2019

(51) Int. Cl.
*G06F 30/331* (2020.01)
*G06F 9/455* (2018.01)

(52) U.S. Cl.
CPC ........ *G06F 30/331* (2020.01); *G06F 9/45504* (2013.01)

(58) Field of Classification Search
CPC ............................ G06F 30/331; G06F 9/45504
USPC .......................................................... 703/28
See application file for complete search history.

(56) References Cited

U.S. PATENT DOCUMENTS

| 2002/0023252 | A1* | 2/2002 | Lee ..................... G06F 30/3312 716/113 |
| 2003/0117971 | A1* | 6/2003 | Aubury .................. G06F 30/33 370/321 |
| 2019/0179989 | A1* | 6/2019 | Emirian ................ G06F 30/331 |
| 2019/0235892 | A1 | 8/2019 | Schkufza et al. |
| 2019/0235893 | A1 | 8/2019 | Schkufza et al. |
| 2019/0236230 | A1 | 8/2019 | Schkufza et al. |
| 2019/0236231 | A1 | 8/2019 | Schkufza et al. |

OTHER PUBLICATIONS

Bergeron et al. "Hardware JIT Compilation for Off-the-Shelf Dynamically Reconfigurable FPGAs", Mar. 2008, 16 pages. (Year: 2008).*
Altera Corporation, "AN 211:Standard Cell ASIC to FPGA Design Methodology and Guidelines", Apr. 2009, 28 pages. (Year: 2009).*
Oguntebi, Tayo et al., GraphOps: A Dataflow Library for Graph Analytics Acceleration, In Proceedings of the 2016 ACM/SIGDA International Symposium on Field-Programmable Gate Arrays, FPGA '16, pp. 111-117, New York, NY, USA, 2016. ACM.

(Continued)

*Primary Examiner* — Suzanne Lo
(74) *Attorney, Agent, or Firm* — Patterson + Sheridan, LLP

(57) ABSTRACT

A method for implementing a distributed hardware system includes retrieving a hardware design described in a hardware description language, where the hardware design includes a plurality of components. The method further includes, for each component of the hardware design, sending the component to a hardware compiler and to one of a plurality of software engines, where the hardware compiler compiles the component to run in one of a plurality of hardware engines and the one software engine simulates the component while the hardware compiler compiles the component for the one hardware engine, and upon completion of the compilation of the component, sending the compiled component to one of the hardware engines to be executed by the one hardware engine and monitoring communication so that the one hardware engine can interact with other components in other hardware engines or software engines.

20 Claims, 13 Drawing Sheets

(56) References Cited

OTHER PUBLICATIONS

Pham, Khoa D. et al., Microkernel Hypervisor for a Hybrid ARM-FPGA Platform, In Application-Specific Systems, Architectures and Processors (ASAP), 2013 IEEE 24th International Conference on, pp. 219-226, Jun. 2013.
Plessl, Christian et al., Zippy-A Coarse-grained reconfigurable array with support for hardware virtualization, In Application-Specific Systems, Architecture Processors, 2005. ASAP 2005. 16th IEEE International Conference on, pp. 213-218. IEEE, 2005.
Pool, Martin et al., distcc: A free distributed c/c++ compiler system, 2016.
Putnam, Andrew et al., A Reconfigurable Fabric for Accelerating Large-Scale Datacenter Services, In 41st Annual International Symposium on Computer Architecture (ISCA), Jun. 2014.
Rupnow, Kyle et al., Block, Drop or Roll(back): Alternative Preemption Methods for RH Multi-Tasking, In FCCM 2009, 17th IEEE Symposium on Field Programmable Custom Computing Machines, Napa, California, USA, Apr. 5-7, 2009, Proceedings, pp. 63-70, 2009.
Russell, J. et al., Icarus Verilog. Book on Demand, 2012.
Sefraoui, Omar et al., OpenStack: Toward an Open-Source Solution for Cloud Computing, International Journal of Computer Applications, 55(3), Oct. 2012.
Shan, Yi et al., FPMR: MapReduce Framework on FPGA A Case Study of Rankboost Acceleration, pp. 93-102. ACM, 2010.
Wasson, Paul et al., Verilator 4.010, 2018.
So, Hayden Kwok-Flay et al., A Unified Hardware/Software Runtime Environment for FPGA-Based Reconfigurable Computers using BORPH, ACM Trans. Embed. Comput. Syst., 7(2):14:1-14:28, Jan. 2008.
So, Hayden Kwok-Flay et al., BORPH: An Operating System for FPGA-Based Reconfigurable Computers. PhD thesis, EECS Department, University of California, Berkeley, Jul. 20, 2007.
So, Hayden Kwok-Hay et al., Olaf'16: Second International Workshop on Overlay Architectures for FPGAs. In Proceedings of the 2016 ACM/SIGDA International Symposium on Field-Programmable Gate Arrays, FPGA '16, pp. 1-1, New York, NY, USA, 2016. ACM.
Steiger, Christoph et al., Operating Systems for Reconfigurable Embedded Platforms: Online Scheduling of Real-Time Tasks.
Suda, Naveen et al., Throughput-Optimized OpenCL-Based FPGA Accelerator for Large-Scale Convolutional Neural Networks. In Proceedings of the 2016 ACM/SIGDA International Symposium on Field-Programmable Gate Arrays, FPGA '16, pp. 16-25, New York, NY, USA, 2016. ACM.
Wolf, Clifford, Yosys Open SYnthesis Suite. http://www:clifford:at/yosys/. (Accessed Jul. 2018).
Zhang, Chen et al., Optimizing FPGA-based Accelerator Design for Deep Convolutional Neural Networks. In Proceedings of the 2015 ACM/SIGDA International Symposium on Field-Programmable Gate Arrays, FPGA '15, pp. 161-170, New York, NY, USA, 2015. ACM.
Debian—Details of Package fpgatools. https://packages:debian:org/stretch/fpgatools. (Accessed Jul. 2018).
FPGAMiner. https://github:com/fpgaminer/Open-Source-FPGA-Bitcoin-Miner. (Accessed Jul. 2018).
SymbiFlow. https://symbiflow:github:io/. (Accessed Jul. 2018).
IEEE Standard VHDL Language Reference Manual. IEEE Std 1076-2008 (Revision of IEEE Std 1076-2002), pp. c1-626, Jan. 2009.
Avalon Interface Specifications, 2017.
Device handbook—Cyclone V Device Overview, 2017.
Intel unveils new Xeon chip with integrated FPGA, touts 20x performance boost—ExtremeTech, 2017.
Aehlig, K. et al. Bazel: Correct, reproducible, fast builds for everyone, 2016.
Auerbach, Joshua et al., Lime: a Java-Compatible and Synthesizable Language for Heterogeneous Architectures, In Proceedings of the ACM International Conference on Object Oriented Programming Systems Languages and Applications, OOPSLA '10, pp. 89-108, New York, NY, USA, 2010. ACM.
Bachrach, Jonathan, Chisel: Constructing Hardware in a Scala Embedded Language. In The 49th Annual Design Automation Conference 2012, DAC '12, San Francisco, CA, USA, Jun. 3-7, 2012, pp. 1216-1225, 2012.
Byma, Stuart, Expanding OpenFlow Capabilities with Virtualized Reconfigurable Hardware, In Proceedings of the 2015 ACM/SIGDA International Symposium on Field-Programmable Gate Arrays, FPGA '15, pp. 94-97, New York, NY, USA, 2015. ACM.
Gasper, Jared et al., Hardware acceleration of database operations, In Proceedings of the 2014 ACM/SIGDA International Symposium on Field-programmable Gate Arrays, FPGA '14, pp. 151-160, New York, NY, USA, 2014. ACM.
Caulfield, Adrian et al., A Cloud-Scale Acceleration Architecture, In Proceedings of the 49th Annual IEEE/ACM International Symposium on Microarchitecture. IEEE Computer Society, Oct. 2016.
Chen, Liang et al., Online Scheduling for Multi-core Shared Reconfigurable Fabric. In Proceedings of the Conference on Design, Automation and Test in Europe, Date '12, pp. 582-585, San Jose, CA, USA, 2012. EDA Consortium.
Chung, Eric S. et al., LINQits: Big Data on Little Clients, In 40th International Symposium on Computer Architecture, ACM, Jun. 2013.
Dai, Guohao et al., FPGP: Graph Processing Framework on FPGA A Case Study of Breadth-First Search, In Proceedings of the 2016 ACM/SIGDA International Symposium on Field-Programmable Gate Arrays, FPGA '16, pp. 105-110, New York, NY, USA, 2016. ACM.
Amazon EC2. Amazon ec2 f1 instance, 2017, 11 pages.
Esfahani, Hamed et al., CloudBuild: Microsoft's Distributed and Caching Build Service, In Proceedings of the 38th International Conference on Software Engineering, ICSE 2016, Austin, TX, USA, May 14-22, 2016—Companion Volume, pp. 11-20, 2016.
GTKwave 3.3 Wave Analyzer User's Guide, http://gtkwave:sourceforge:net. (Accessed Jul. 2018).
Hamilton, Brandon Kyle et al., Mixed Architecture Process Scheduling on Tightly Coupled Reconfigurable Computers, In Field-Programmable Custom Computing Machines (FCCM), 2014 IEEE 22nd Annual International Symposium on, pp. 240-240, May 2014.
Arria V Device Handbook. vol. 1: Device Overview and Datasheet. 2012.
Heydon, Allan et al., The Vesta Software Configuration Management System, Monographs in Computer Science, Springer, 2006.
Intel, Quartus Prime Software, 2018.
István, Zsolt et al., Caribou: Intelligent Distributed Storage, PVLDB, 10(11):1202-1213, 2017.
István, Zsolt et al., Consensus in a Box: Inexpensive Coordination in Hardware, In Proceedings of the 13th Usenix Conference on Networked Systems Design and Implementation, NSDI'16, pp. 425-438, Berkeley, CA, USA, 2016. USENIX Association.
Kalte, Heiko et al., Context Saving and Restoring for Multitasking in Reconfigurable Systems, In Field Programmable Logic and Applications, 2005. International Conference on, pp. 223-228, Aug. 2005.
Kapitza, Rüdiger et al., CheapBFT: Resource-efficient Byzantine Fault Tolerance, In Proceedings of the 7th ACM European Conference on Computer Systems, EuroSys '12, pp. 295-308, New York, NY, USA, 2012. ACM.
Kara, Kaan et al., Fast and Robust Hashing for Database Operators, In 26th International Conference on Field Programmable Logic and Applications, FPL 2016, Lausanne, Switzerland, Aug. 29-Sep. 2, 2016, pp. 1-4, 2016.
Khawaja, Ahmed et al., Sharing, Protection, and Compatibility for Reconfigurable Fabric with AmorphOS, To Appear in OSDI, 2018.
Khronos Group. The OpenCL Specification, Version 1.0, 2009.
Kivity, Avi et al., kvm: the Linux Virtual Machine Monitor, In Proceedings of the Linux symposium, vol. 1, pp. 225-230, 2007.
Lebedev, Ilia A. et al., Exploring Many-Core Design Templates for FPGAs and ASICs, Int. J. Reconfig. Comp., 2012:439141:1-439141:15, 2012.

(56) References Cited

OTHER PUBLICATIONS

Leber, Christian et al., High Frequency Trading Acceleration using FPGAs, In Proceedings of the 2011 21st International Conference on Field Programmable Logic and Applications, FPL '11, pp. 317-322, Washington, DC, USA, 2011. IEEE Computer Society.

Lee, Trong-Yen et al., Hardware Context-Switch Methodology for Dynamically Partially Reconfigurable Systems. J. Inf. Sci. Eng., 26:1289-1305, 2010.

Levinson, L. et al., Preemptive Multitasking on FPGAs, In Field-Programmable Custom Computing Machines, 2000 IEEE Symposium on, pp. 301-302, 2000.

Li, Sheng et al., Architecting to Achieve a Billion Requests Per Second Throughput on a Single Key-Value Store Server Platform, In Proceedings of the 42Nd Annual International Symposium on Computer Architecture, ISCA '15, pp. 476-488, New York, NY, USA, 2015. ACM.

Lübbers, Enno et al., ReconOS: Multithreaded Programming for Reconfigurable Computers, ACM Trans. Embed. Comput. Syst., 9(1):8:1-8:33, Oct. 2009.

Microsoft, Microsoft Azure Goes Back to Rack Servers With Project Olympus, 2017.

Mishra, Mahim et al., Tartan: Evaluating Spatial Computation for Whole Program Execution. SIGOPS Oper. Syst. Rev., 40(5):163-174, Oct. 2006.

Moore, Nicholas et al., An Extensible Framework for Application Portability Between Reconfigurable Supercomputing Architectures, 2007, 3 pages.

* cited by examiner

JUST-IN-TIME HARDWARE FOR FIELD PROGRAMMABLE GATE ARRAYS

BACKGROUND

Every year the semiconductor industry makes improvements in the size of a transistor and thus the number of transistors available on a semiconductor device of a given die area increases. However, the improved transistor density of the semiconductor device encounters a problem. As the transistor density increases, the device consumes more power and ultimately exceeds safe thermal limits for the given die area. Because the power consumed by the die is a direct function of clock speed, the power limit acts as a barrier that constrains the maximum clock speed and computing performance available from a single-threaded-general purpose processor. In response to this power barrier, processor architectures have incorporated parallelism in the form of multiple core processors. However, the power consumption problem remains even with multi-core processors, regardless of the multi-core architecture. In addition, the degree of parallelism achievable by multi-core architectures is limited and this limitation along with the power barrier becomes a significant source of "dark silicon," i.e., unpowered silicon. In one study, the speedup of the system increased only by about a factor of eight although improved transistor density offered a potential performance increase by a factor of more than 32.

Clearly, the performance that is potentially available from improved transistor technology is not being realized by today's processing architectures. To extract more performance, alternatives to current processing architectures are needed. One alternative is the use of field programmable gate arrays (FPGAs). The performance of FPGA-implemented tasks or functions can easily exceed the performance of a general purpose processor by several orders of magnitude. However, design of an FPGA is a difficult and lengthy process. The process involves writing a design in a hardware description language (HDL), such as Verilog or VHDL, simulating the design, synthesizing the HDL design to a register transfer language (RTL), and then placing and routing the design for a specific type of FPGA. This process can take hours or even days. In addition, if and when the design is loaded onto the FPGA and the result does not function as expected or has an error, the entire process must be repeated to find the error This design flow impedes the adoption of FPGA designs because the debug cycle is too long and the design is targeted to a specific type of FPGA. The long design cycles makes the use of different FPGAs difficult and almost rules out optimizing the design, as the optimization would take even more design cycles. Therefore, an improved design process is desirable to make FPGA development easier.

SUMMARY

One embodiment is a method for executing a runtime on one or more processors to implement a distributed hardware system. The method includes retrieving from storage a hardware design described in a hardware description language, where the hardware design includes a plurality of components. The method further includes, for each component of the hardware design, sending the component to a hardware compiler and to one of a plurality of software engines, where the hardware compiler compiles the component to run in one of a plurality of hardware engines and the one software engine simulates the component while the hardware compiler compiles the component for the one hardware engine, and upon completion of the compilation of the component, sending the compiled component to one of the hardware engines to be executed by the one hardware engine and monitoring communication so that the one hardware engine can interact with other components in other hardware engines or software engines.

Further embodiments of the present invention include a non-transitory computer-readable storage medium comprising instructions that cause a computer system to carry out one or more aspects of the above method, and a computer system configured to carry out one or more aspects of the above method.

DETAILED DESCRIPTION

Embodiments disclosed herein include a process which combines a runtime, along with one or more software engines and one or more hardware engines to create just-in-time hardware for FPGAs.

Figure 1:
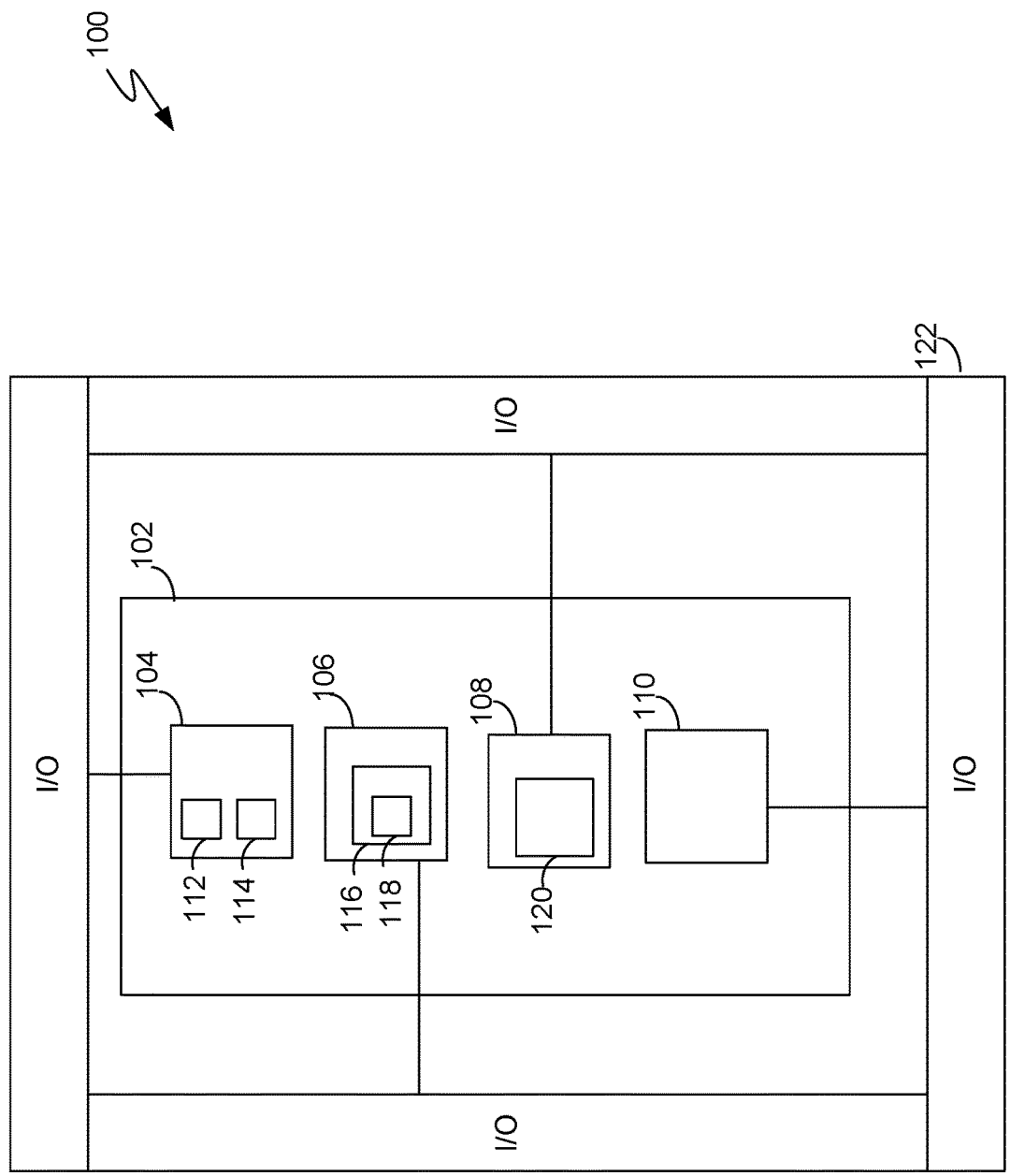
FIG. 1 depicts a design of a number of functional modules to be loaded and executed on hardware such as an FPGA.

FIG. 1 depicts a design 100 of a number of functional modules 102, 104, 106, 108, 110, 122 to be loaded and executed on hardware such as an FPGA. In FIG. 1, each of the functional modules 102, 104, 106, 108, 110, 122 can be independent or can include sub-modules, thus creating a hierarchy of modules. For example, module 104 includes two sub-modules 112 and 114, while module 106 includes sub-module 116 which further includes sub-module 118. Module 108 includes sub-module 120 and module 110 has no sub-modules. In addition, each of the functional modules 104, 106, 108, 110 has access to IO module 122 so that the module can communicate with items external to the functional modules, such as buttons, switches, lights, transducers and the like.

Figure 2:
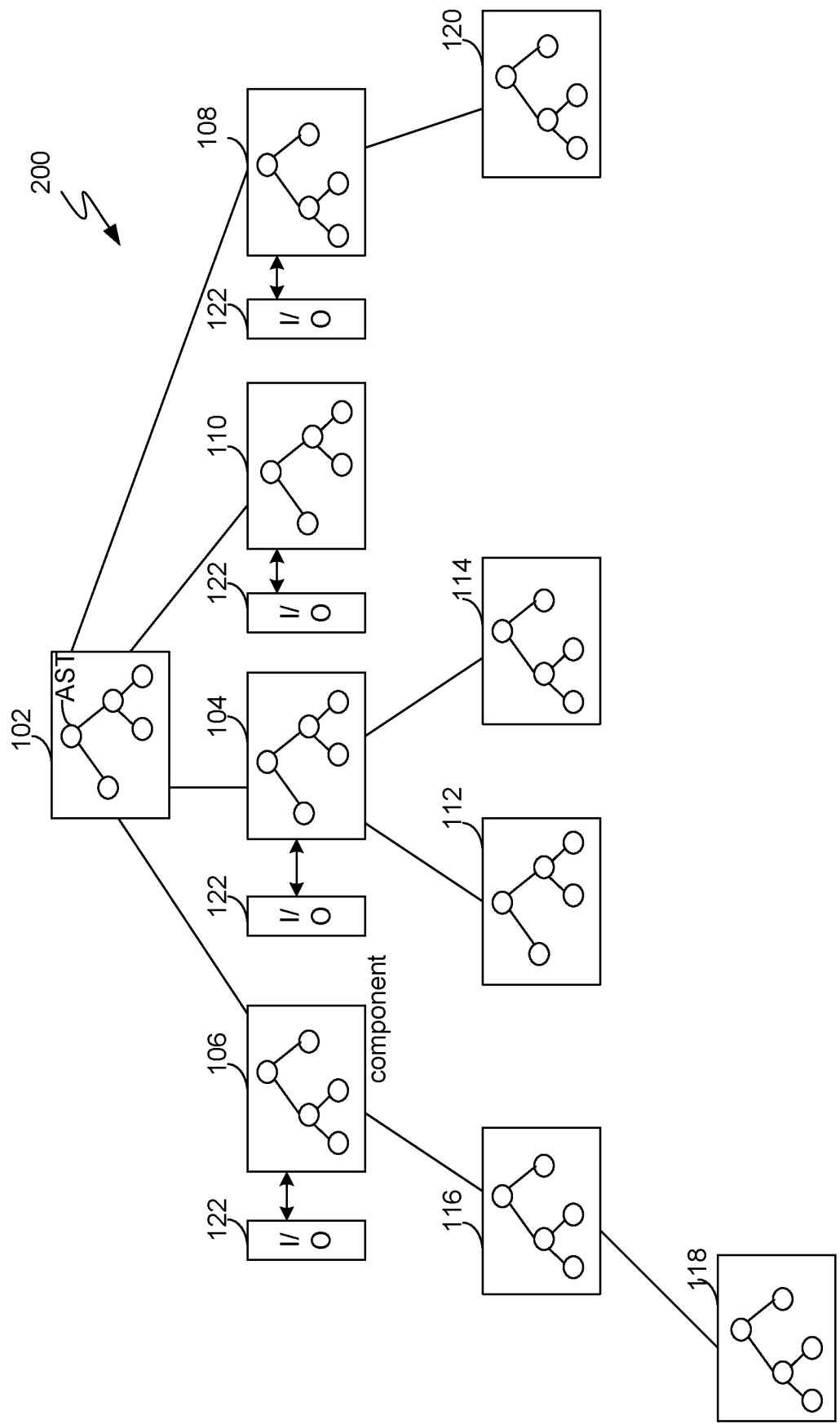
FIG. 2 depicts a parsing of the design in FIG. 1 to capture the hierarchy of functional modules in the design.

FIG. 2 depicts a parsing 200 of design 100 in FIG. 1 to capture the hierarchy of functional modules in the design. The root module in the hierarchy is module 102, which has sub-modules 104, 106, 108, 110, 116 and leaves 118, 112, 114, 120. In addition, each of the sub-modules is parsed into an abstract syntax tree to represent the design of the sub-module.

Figure 3:
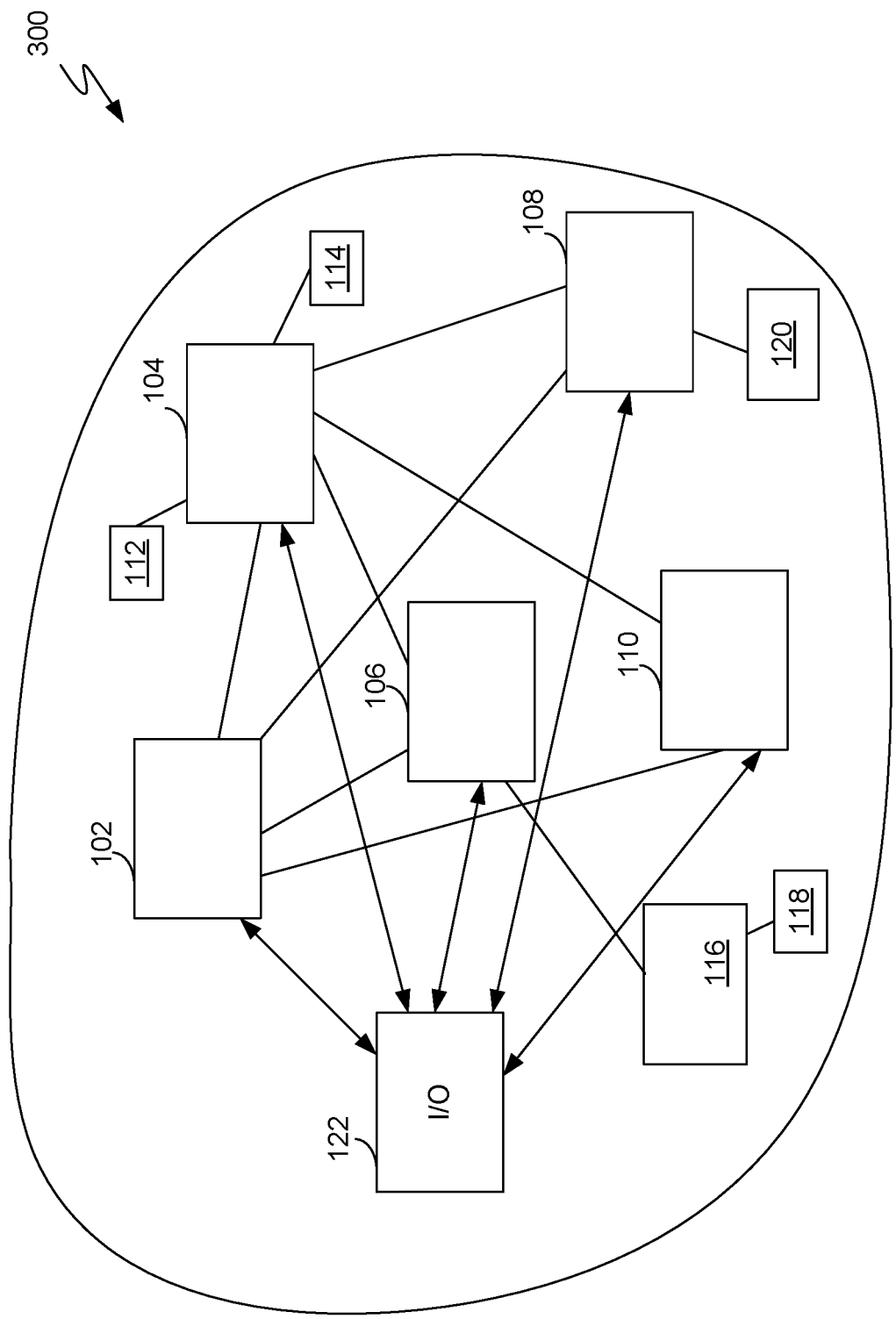
FIG. 3 depicts a physical distributed system that implements the hierarchical set of functional modules in the design of FIG. 2.

FIG. 3 depicts a physical distributed system 300 that implements the hierarchical set of functional modules 102, 104, 106, 108, 110, 112, 114, 116, 118, 120 in the design of FIG. 2. Thus, the design of FIG. 2 is realized in hardware as a distributed system comprising a set of components 102, 104, 106, 108, 110, 112, 114, 116, 118, 120, each of which communicates with one or more other components.

Figure 4A:
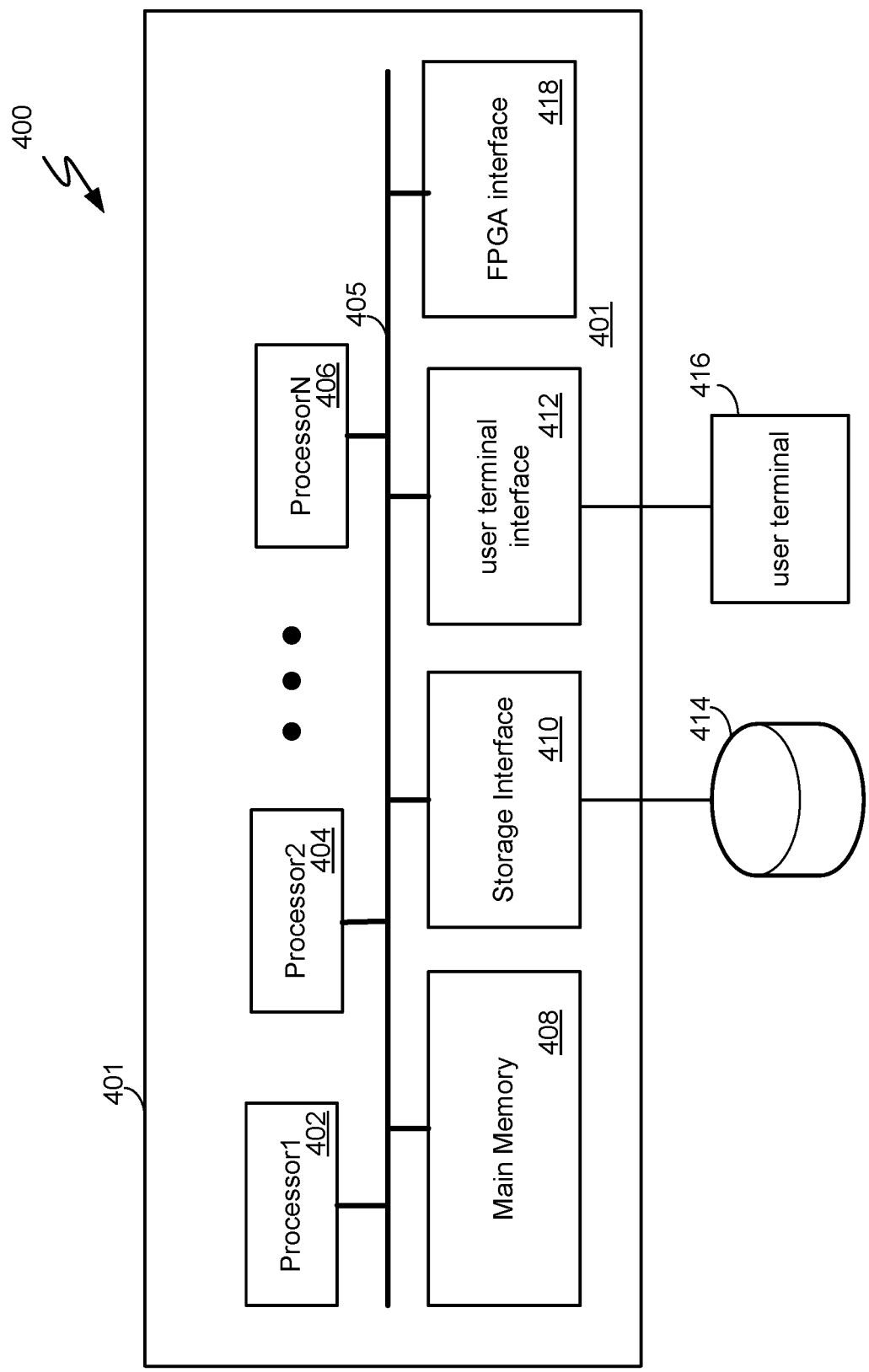
FIG. 4A depicts a system in which embodiments described herein may be practiced.

FIG. 4A depicts a system 400 in which embodiments described herein may be practiced. System 400 includes a computer system 401 having one or more general or special purpose processors 402, 404, 406 coupled to which are a bus 405, main memory 408, a storage interface 410 that connects to storage 414, a user terminal interface 412 that connects to a user terminal 416 and an FPGA interface 418 for connecting to a bank of FPGAs.

Figure 4B:
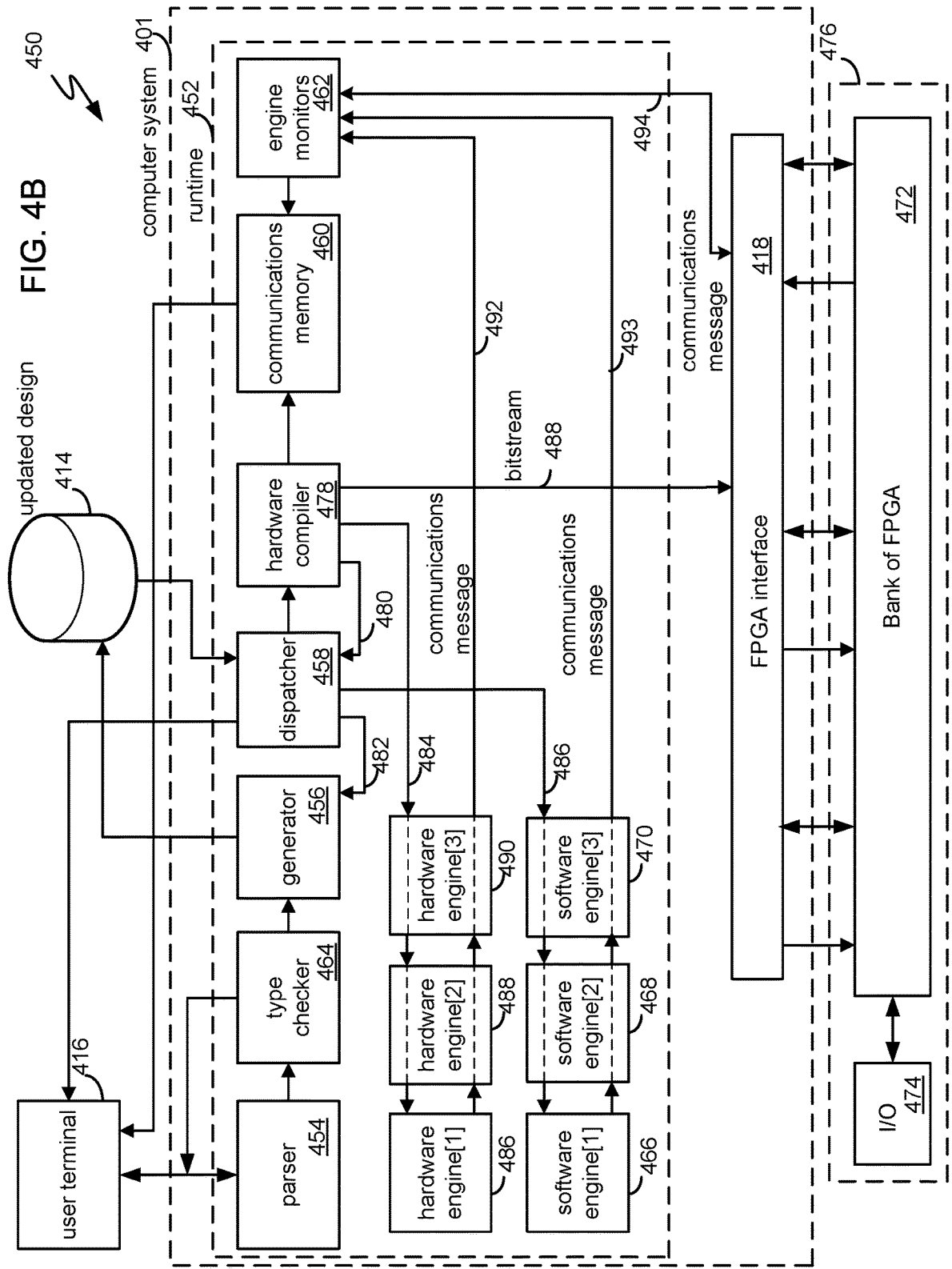
FIG. 4B depicts processing modules in a system used to develop and implement the design of FIG. 1 in one embodiment.

FIG. 4B depicts processing modules in a system 450 used to develop and implement the design of FIG. 1 in one embodiment. System 450 includes computer system 401, such as the one described in FIG. 4A. Computer system 401 includes an FPGA interface 418 which connects to a bank 472 of FPGAs, which in turn is coupled to I/O 474. Also connected to the computer system 401 are a user terminal 416 and storage 414. In computer system 401, main memory 408 includes instructions, which when processed by one or more processors 402, 404, 406, execute a runtime 452. Runtime 452 includes a parser 454, a type checker 464, a generator 456, a dispatcher 458, a hardware compiler 478, a communications memory 460, engine monitors 462, one or more hardware engines 486, 488, 490 and one or more software engines 466, 468, 470.

Parser 454, type checker 464, generator 456 and dispatcher 458 are configured to receive user input from user terminal 416 or a request from dispatcher 458 and to generate and store a representation of a hardware design to be loaded into bank 472 of FPGAs.

Dispatcher 458, hardware compiler 478, communications memory 460, engine monitors 462, hardware engines 486, 488, 490 and software engines 466, 468, 470 are configured to execute and simulate a hardware design to be loaded into bank 472 of FPGAs. In particular, hardware compiler 478 places and routes the design, performs timing checks on the design and checks regarding the target FPGA into which the design is to be loaded. Each of the hardware engines 486, 488, 490 is configured to execute the placed and routed design of a component of the design. Each of the software engines 466, 468, 470 is configured to simulate a software version (HDL) of a component of the design. Communications memory 460 permits software engines 466, 468, 470, hardware engines 486, 488, 490, and FPGAs in bank 472 of FPGAs to communicate with each other by receiving messages from engine monitors 462.

Figure 5A:
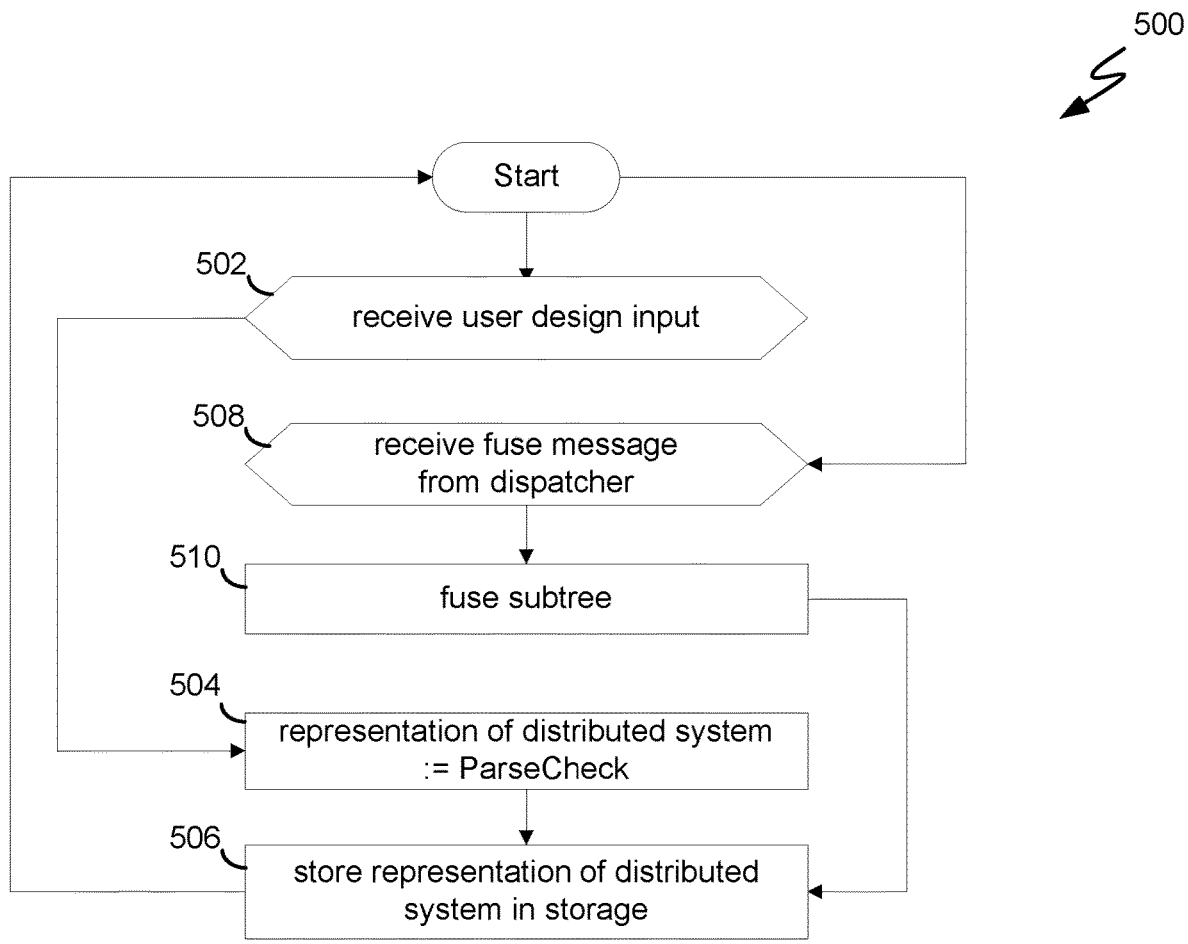
FIG. 5A depicts a flow chart for processing a design change in one embodiment.

FIG. 5A depicts a flow chart 500 for processing a design change in one embodiment. In step 502, upon receiving design input from the user, the runtime calls a function, ParseCheck 550, in step 504, which is further described in reference to FIG. 5B and in step 506 stores a representation of the distributed system 300 in FIG. 3 in storage 414. Alternatively, upon receiving a request to fuse a sub-tree of the design as depicted in FIG. 2 from dispatcher 458, runtime 452 stores the updated representation distributed system 300 in storage 414. The fusing of sub-trees is discussed further below.

Figure 5B:
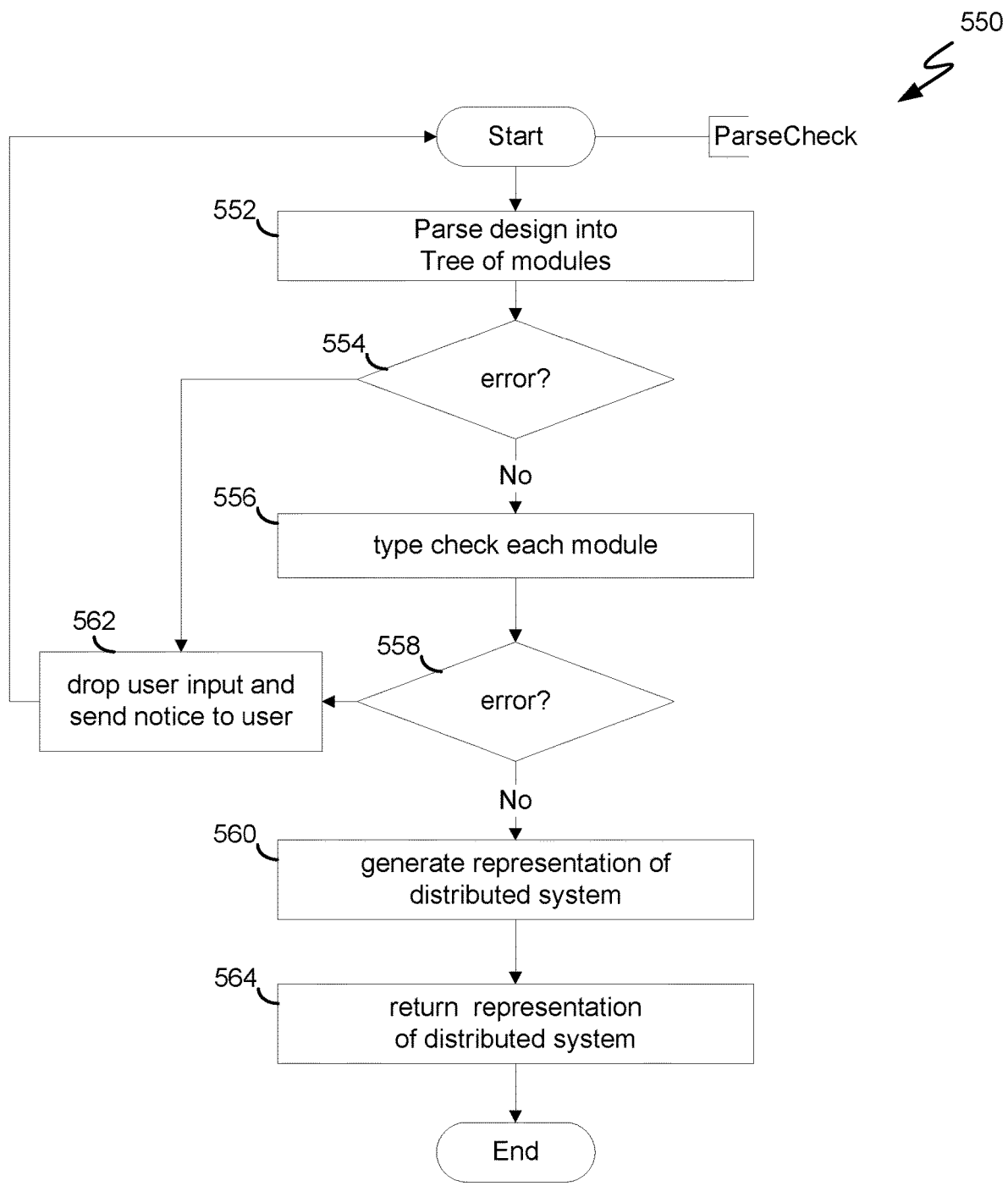
FIG. 5B depicts a flow chart of the ParseCheck function in one embodiment.

FIG. 5B depicts a flow chart of the ParseCheck function 550 in one embodiment. Upon the function being called in FIG. 5A, parser 454 parses the design of FIG. 1 in step 552 into the representation depicted in FIG. 2. i.e., a tree of modules. If there is an error in the design input from the user, as determined in step 554, the user input is dropped and a notice is sent in step 562 to the user via terminal 416. Next, in step 566, type checker 464 in ParseCheck function 550 type checks each module of the design and if there is any error as determined in step 558, again the user input is dropped and a notice is sent in step 562 to the user via terminal 416. After parsing and type checking the design input, generator 456 in the ParseCheck function 550 generates a representation of the design as a set of components of distributed system 300 depicted in FIG. 3 and the function returns the representation in step 564.

Figure 6A:
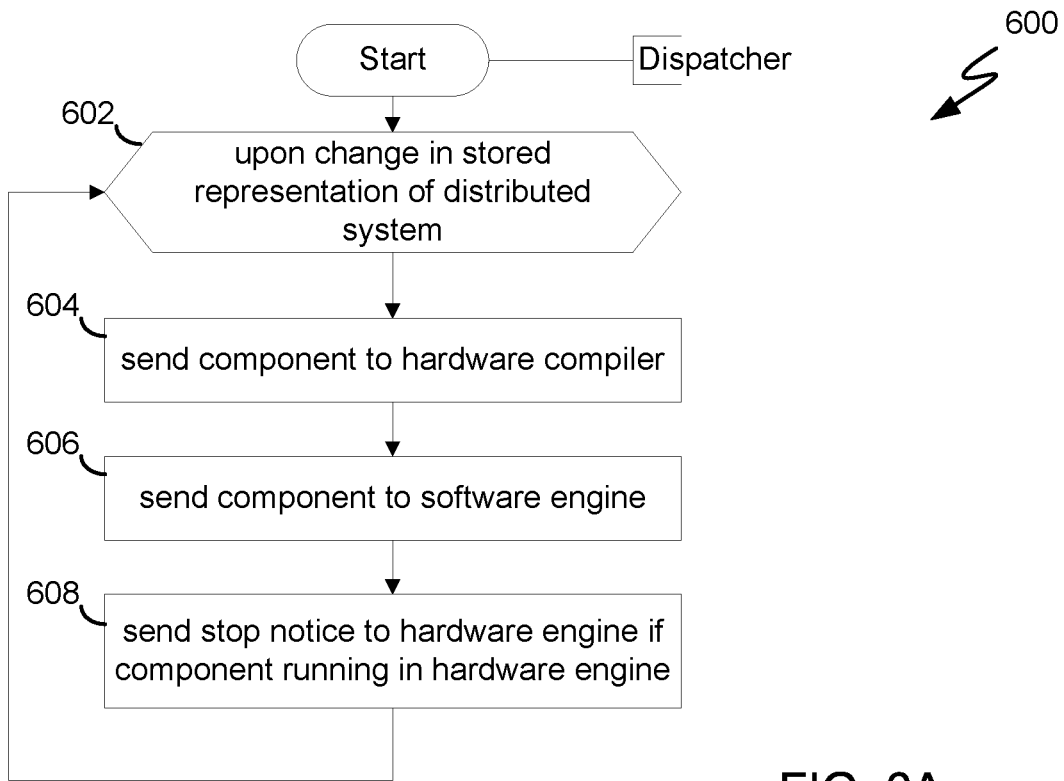
FIG. 6A depicts a flow chart of an aspect of the dispatcher of the runtime system in FIG. 4B according to an embodiment.

FIG. 6A depicts a flow chart 600 of an aspect of dispatcher 458 of runtime system 452 in FIG. 4B according to an embodiment. In FIG. 6A, upon detecting in step 602 that one of the components of the stored representation of distributed system 300 has been changed, dispatcher 458 sends the changed component in step 604 to hardware compiler 478 and at the same time to one of the available software engines 466, 468, 470 in step 606. In addition, if one of the hardware engines 486, 488, 490 was running the component prior to the change, then dispatcher 458 sends in step 608 a stop notice to that hardware engine. Thus, one of the software engines 466, 468, 470 simulates the changed component while at the same time hardware compiler 478 compiles the changed component.

Figure 6B:
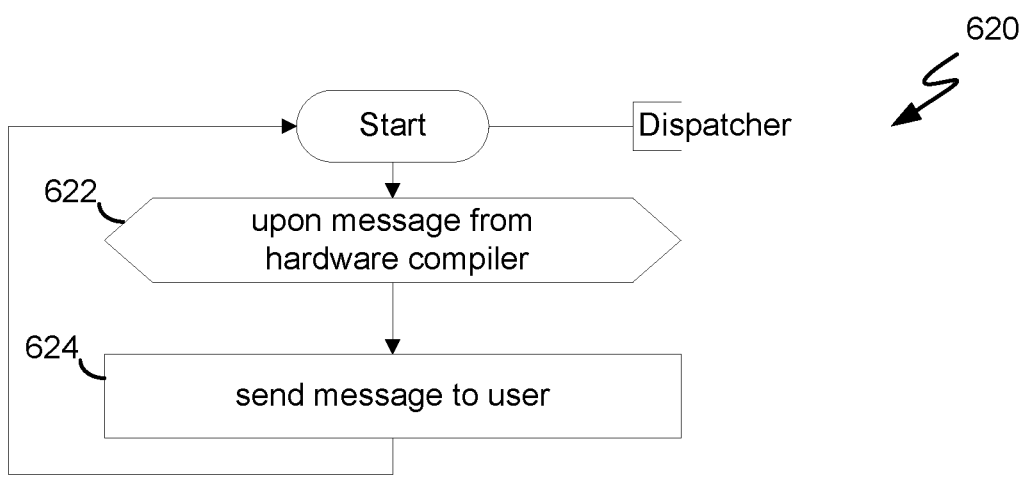
FIG. 6B depicts a flow chart of another aspect of the dispatcher of the runtime system in FIG. 4B according to an embodiment.

FIG. 6B depicts a flow chart 620 of another aspect of dispatcher 458 of runtime system 452 in FIG. 4B according to an embodiment. In FIG. 6B, when dispatcher 458 receives any message from hardware compiler 480 in step 622, it forwards in step 624 the message to the user via the user terminal 416. These messages inform the user of any errors detected by dispatcher 458 or hardware compiler 478 and which require user correction.

Figure 6C:
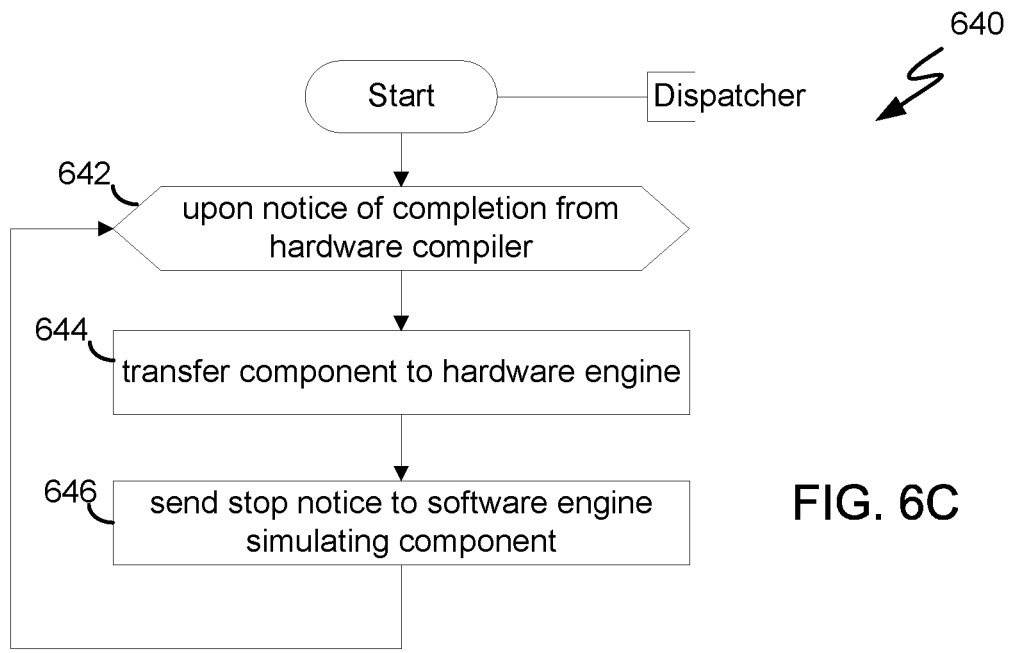
FIG. 6C depicts a flow chart of yet another aspect of the dispatcher of the runtime system in FIG. 4B according to an embodiment.

FIG. 6C depicts a flow chart 640 of yet another aspect of dispatcher 458 of runtime system 452 in FIG. 4B according to an embodiment. In FIG. 6C, when dispatcher 458 receives notice of completion from hardware compiler 478 in step 642, dispatcher 458 transfers the component in step 644 to one of the available hardware engines 486, 488, 490.

Figure 6D:
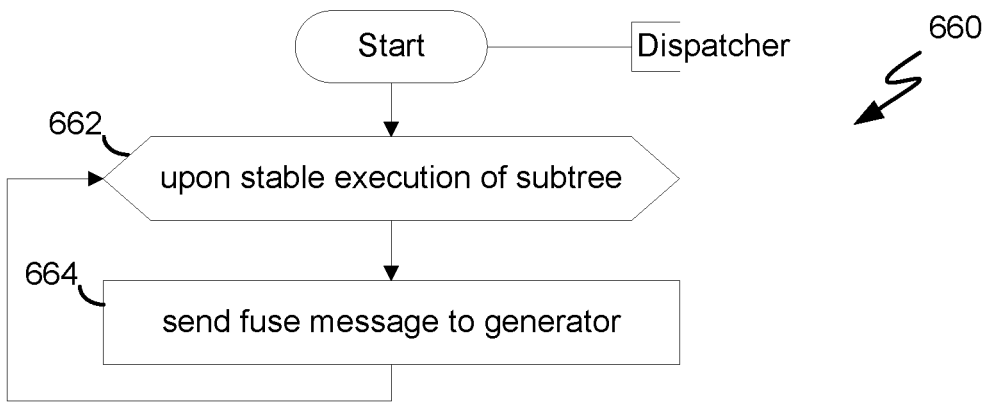
FIG. 6D depicts a flow chart of yet another aspect of the dispatcher of the runtime system in FIG. 4B according to an embodiment.

FIG. 6D depicts a flow chart 660 of yet another aspect of dispatcher 458 of runtime system 452 in FIG. 4B according to an embodiment. In FIG. 6D, when dispatcher 458 discovers that all of the components of a sub-tree of the design in FIG. 2 have meet a stability test in step 662, dispatcher 458 sends in step 664 a fuse message to generator 456. In one embodiment, the stability test determines that the components of a given sub-tree, say for example, components 104, 112, 114 in FIG. 2, have been running for a certain amount of time without requiring correction by the user and thus represent a stable design. The fuse message requests that generator 456 fuse the components of the sub-tree together to become a single component. This initiates a storage of the updated design as described in reference to FIG. 5A.

Figure 6E:
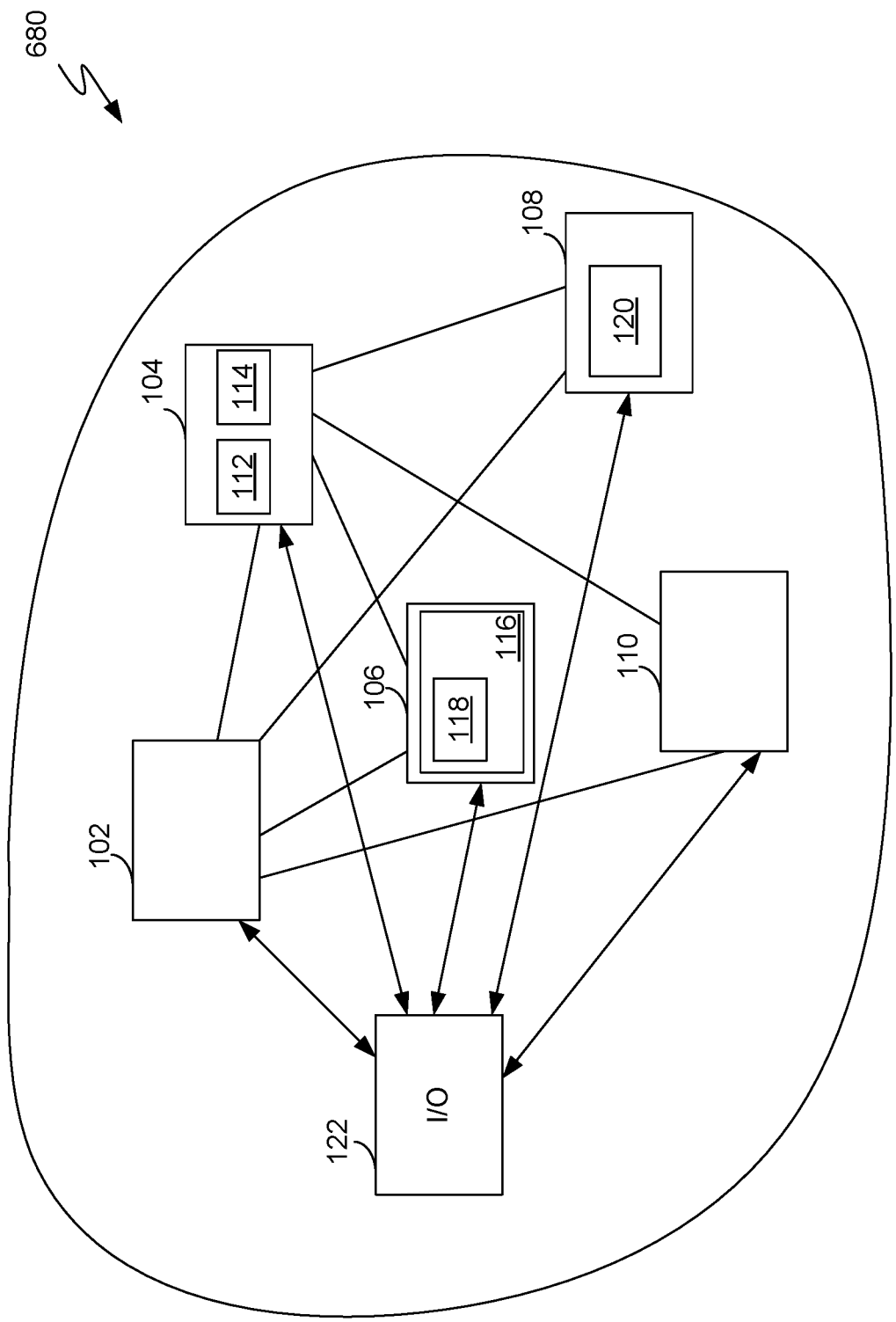
FIG. 6E depicts the distributed system of FIG. 3 after fusions have occurred.

FIG. 6E depicts the distributed system 680 of FIG. 3 after fusions have occurred. In the figure, components 112 and 114 have been running for a predetermined amount of time without requiring correction by the user and thus meet a criterion for a stable design. So, components 112 and 114 are fused into component 104, which is now treated a single component. Similarly, components 116 and 118 have been fused into component 106 and component 120 is fused onto 108. Eventually, the entire design will be fused into a single component.

Figure 7A:
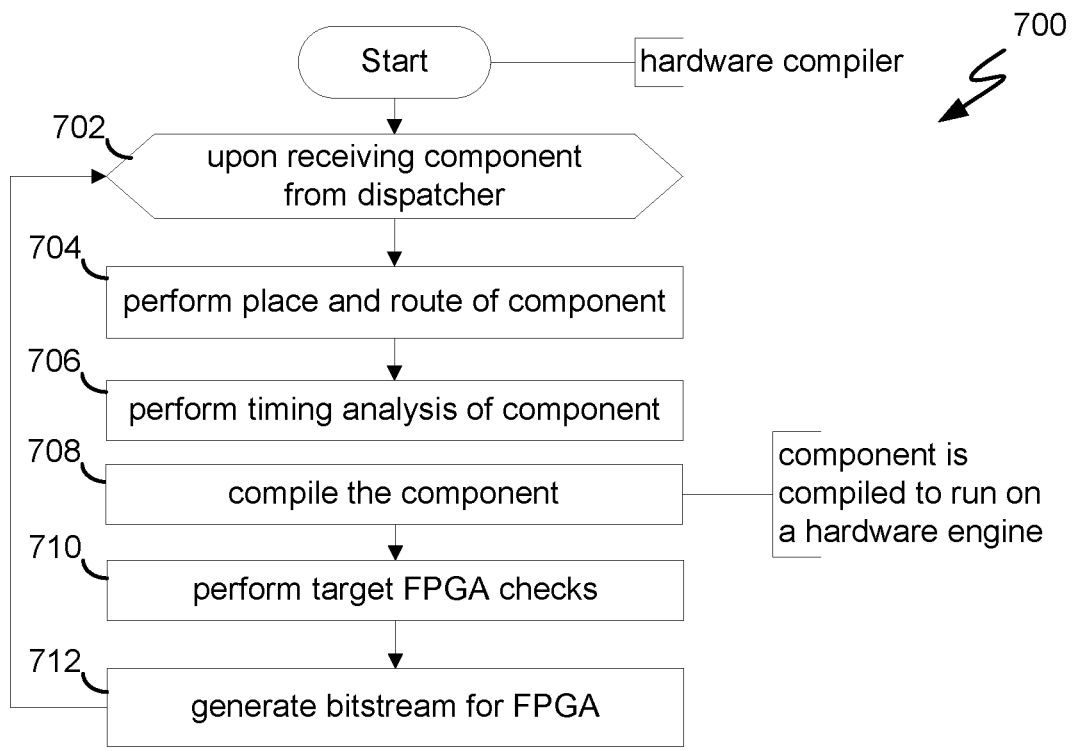
FIG. 7A depicts a flow chart of an aspect of the hardware compiler in the runtime system of FIG. 4B according to an embodiment.

FIG. 7A depicts a flow chart 700 of an aspect of hardware compiler in runtime system 452 of FIG. 4B according to an embodiment. When the hardware compiler receives a component from dispatcher 458 in step 702, hardware compiler 478 performs a place and route in step 704, and a timing analysis in step 706 of the component. In one embodiment, the place and route and timing analysis conform to design flow of Quartus®. Also, in some embodiments, pre-compiled components are added to the component for communicating with the communication memory in the runtime and for interacting with any external devices, such as buttons, switches and transducers. In step 708, hardware compiler 478 compiles the component so that it can run on a hardware engine and in step 710, performs checks to ensure that the design of the component will operate in a target FPGA according to the constraints imposed by the particular FPGA. In step 712, hardware compiler 478 generates an appropriate bitstream for programming the targeted FPGA. The steps 704-712 are repeated for each component received from dispatcher 458.

Figure 7B:
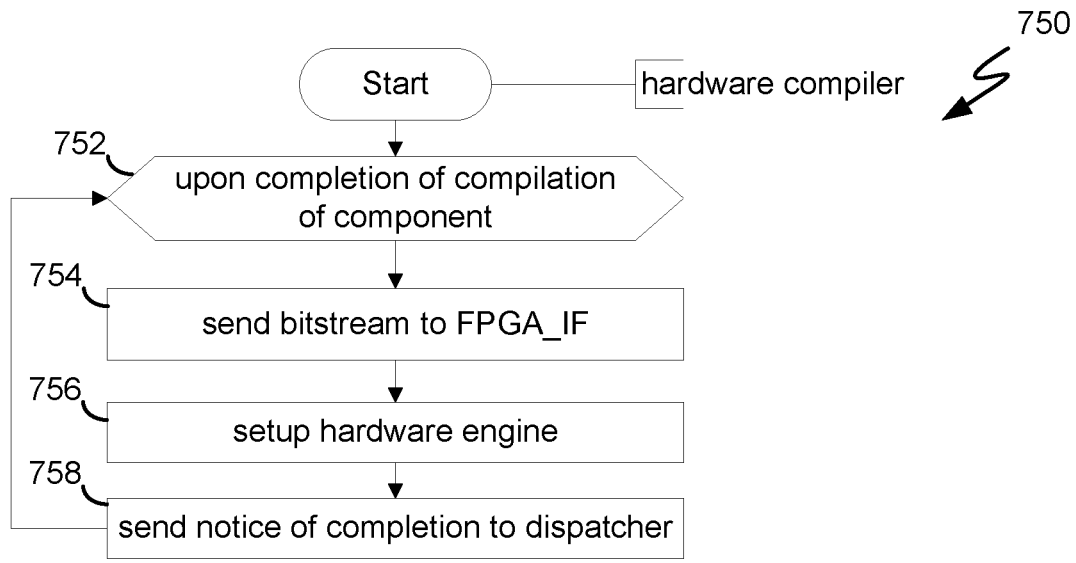
FIG. 7B depicts a flow chart of another aspect of the hardware compiler in the runtime system of FIG. 4B according to an embodiment.

FIG. 7B depicts a flow chart 750 of another aspect of the hardware compiler in the runtime system of FIG. 4B according to an embodiment. In FIG. 7B, when hardware compiler 478 completes a compilation of a component in step 752, hardware compiler 478 sends the previously generated bitstream for the component to the FPGA interface in step 754 and sets up an available hardware engine to execute the component in step 756. In step 758, hardware compiler 478 sends notice of completion to dispatcher 458 via path 480 in FIG. 4B.

Figure 8:
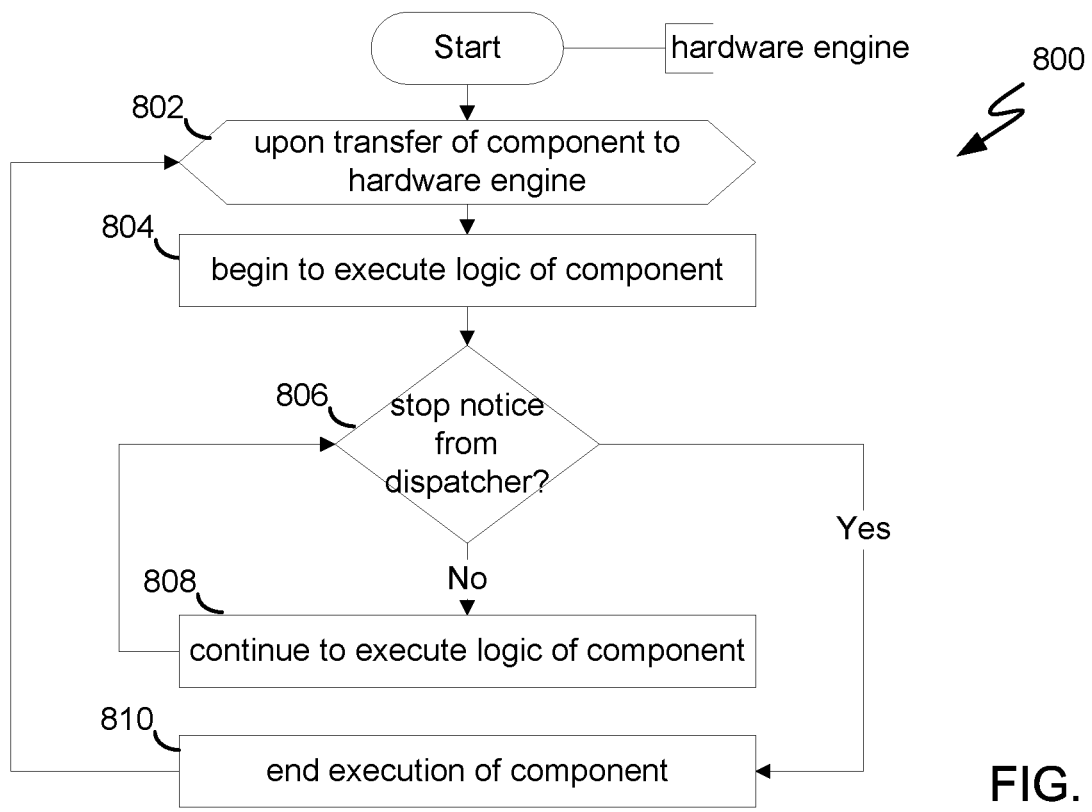
FIG. 8 depicts a flow chart of a hardware engine in the runtime system of FIG. 4B according to an embodiment.

FIG. 8 depicts a flow chart 800 of a hardware engine in runtime system 452 of FIG. 4B according to an embodiment. Upon transfer of a component to one of the hardware engines 486, 488, 490 in step 802, the hardware engine begins simulation of the component in step 804. If, in step 806, the hardware engine receives a stop notice from hardware compiler 458 via path 484, then the hardware engine ends execution of the component in step 810. Otherwise, it continues executing the component in step 808.

Figure 9:
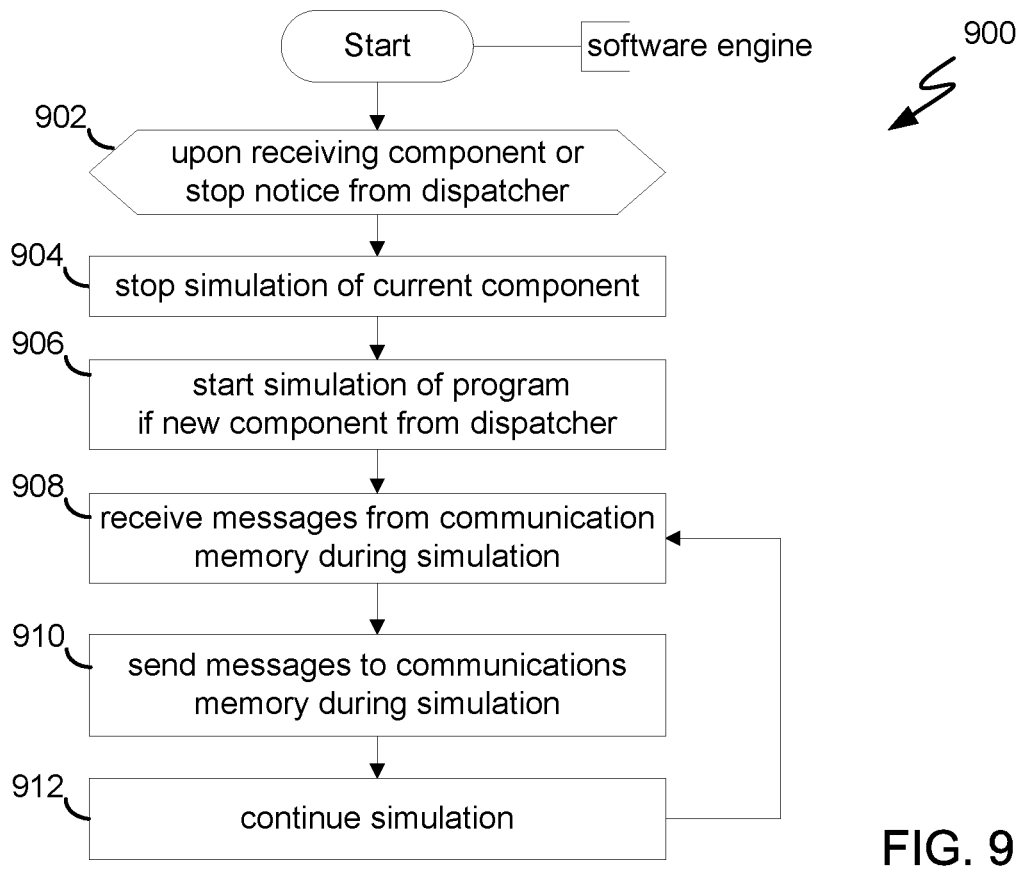
FIG. 9 depicts a flow chart of one of the software engines runtime system of FIG. 4B according to an embodiment.

FIG. 9 depicts a flow chart 900 of one of the software engines 466, 468, 470 in runtime system 452 of FIG. 4B according to an embodiment. In step 902, when the software engine receives a component from dispatcher 458 or a stop notice from dispatcher 458 via path 486, it stops simulation of any current component it is simulating in step 904 If a new component was received, the software engine starts simulation of the just received component in step 906. While continuing simulation in step 912, it receives massages from communication memory in step 908 and sends messages to communications memory in step 920. This continues until dispatcher 458 sends a new component in step 902 for simulation.

Figure 10:
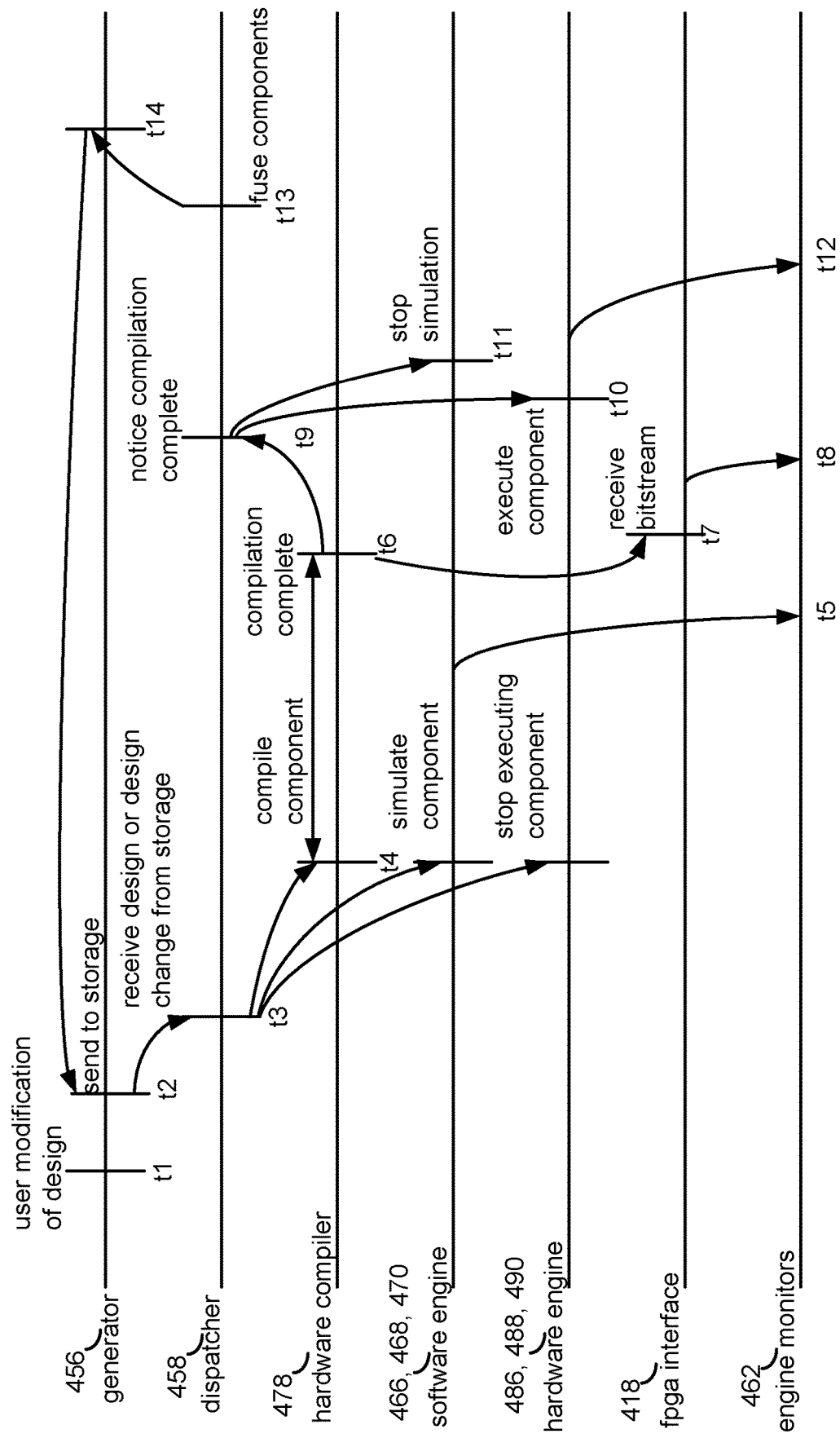
FIG. 10 depicts a time line in one embodiment for the activities of generator, dispatcher, hardware compiler, one of the software engines, one of the hardware engines and the engine monitors of FIG. 4B.

FIG. 10 depicts a time line in one embodiment for the activities of generator 456, dispatcher 458, hardware compiler 478, one of the software engines 466, 468, 470, one of the hardware engines 486, 488, 490 and engine monitors 462 of FIG. 4B. At time t1, generator 456 generates components of a design or modified design in accordance with the steps of FIGS. 5A, 5B. At time t2, generator 456 stores the design or modified design in storage. At time t3, dispatcher 458 receives the modified design and at time t4 sends a modified component to the hardware compiler 478, to one of the software engines 466, 468, 470 and a notice to stop one of the hardware engines 486, 488, 490 currently simulating the component in accordance with the steps of FIG. 6A. A time t5, during the simulation of the component, one of the software engines 466, 468, 470 sends communication messages to one of the engine monitors 462 to communicate with other components of the design. At time t6, hardware compiler 478 indicates that the compilation of the component is completed. At time t7, hardware compiler 478 sends the bitstream for the component to FPGA interface 418 so that it can be downloaded into one or more FPGAs. At time t8, FPGA interface 418 sends messages to one of the monitoring engines 462 so that one or more of the FPGAs can communicate with other components of the design. At time t9, hardware compiler 478 notifies dispatcher 458 that the compilation of the component is complete. At time t10, dispatcher 458 sends the component to one of the available hardware engines 466, 468, 470 and, at time t11, stops simulation of the component in the software engine. At time t12, one of the hardware engines 486, 488, 490 running the component sends messages to one of the engine monitors 462 to communicate with the other components of the design. At time t13, dispatcher 458 notifies the user of a stable set of components and a request to fuse the set of components into a single component and, at time t14, sends the modified design to storage 414. The process then repeats until the entire design is fused into a single component.

Several advantages arise from the above described system. First, because components of the design can reside in either hardware engines or software engines, the design can be moved to a different set of hardware and software engines residing on a runtime of a different computer system. Second, because the hardware compiler can be configured to generate bit streams for any target FPGA, not all of the FPGAs need to be of the same type. Mixing of different FPGAs from different vendors is possible. Third, the FPGAs available on one computer system can be different on another computer system to which the design is moved.

Certain embodiments as described above involve a hardware abstraction layer on top of a host computer. The hardware abstraction layer allows multiple contexts to share the hardware resource. In one embodiment, these contexts are isolated from each other, each having at least a user application running therein. The hardware abstraction layer thus provides benefits of resource isolation and allocation among the contexts. In the foregoing embodiments, virtual machines are used as an example for the contexts and hypervisors as an example for the hardware abstraction layer. As described above, each virtual machine includes a guest operation system in which at least one application runs. It should be noted that these embodiments may also apply to other examples of contexts, such as containers not including a guest operation system, referred to herein as "OS-less containers" (see, e.g., www.docker.com). OS-less containers implement operating system-level virtualization, wherein an abstraction layer is provided on top of the kernel of an operating system on a host computer. The abstraction layer supports multiple OS-less containers each including an application and its dependencies. Each OS-less container runs as an isolated process in user space on the host operating system and shares the kernel with other containers. The OS-less container relies on the kernel's functionality to make use of resource isolation (CPU, memory, block I/O, network, etc.) and separate namespaces and to completely isolate the application's view of the operating environments. By using OS-less containers, resources can be isolated, services restricted, and processes provisioned to have a private view of the operating system with their own process ID space, file system structure, and network interfaces. Multiple containers can share the same kernel, but each container can be constrained to only use a defined amount of resources such as CPU, memory and I/O.

The various embodiments described herein may be practiced with other computer system configurations including hand-held devices, microprocessor systems, microprocessor-based or programmable consumer electronics, minicomputers, mainframe computers, and the like.

One or more embodiments of the present invention may be implemented as one or more computer programs or as one or more computer program modules embodied in one or more computer readable media. The term computer readable medium refers to any data storage device that can store data which can thereafter be input to a computer system. Computer readable media may be based on any existing or subsequently developed technology for embodying computer programs in a manner that enables them to be read by a computer. Examples of a computer readable medium include a hard drive, network attached storage (NAS), read-only memory, random-access memory (e.g., a flash memory device), a CD (Compact Discs)—CD-ROM, a CD-R, or a CD-RW, a DVD (Digital Versatile Disc), a magnetic tape, and other optical and non-optical data storage devices. The computer readable medium can also be distributed over a network coupled computer system so that the computer readable code is stored and executed in a distributed fashion.

Although one or more embodiments of the present invention have been described in some detail for clarity of understanding, it will be apparent that certain changes and modifications may be made within the scope of the claims. Accordingly, the described embodiments are to be considered as illustrative and not restrictive, and the scope of the claims is not to be limited to details given herein, but may be modified within the scope and equivalents of the claims. In the claims, elements and/or steps do not imply any particular order of operation, unless explicitly stated in the claims.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the invention(s). In general, structures and functionality presented as separate components in exemplary configurations may be implemented as a combined structure or component. Similarly, structures and functionality presented as a single component may be implemented as separate components. These and other variations, modifications, additions, and improvements may fall within the scope of the appended claim(s).

What is claimed is:

1. A method for executing a runtime on one or more processors to implement a distributed hardware system, comprising:
    retrieving from storage a hardware design described in a hardware description language, wherein the hardware design includes a plurality of components; and
    for each component of the hardware design,
        sending the component to a hardware compiler and to one of a plurality of software engines, wherein the hardware compiler compiles the component to run in one of a plurality of hardware engines and wherein the one software engine simulates the component while the hardware compiler compiles the component for the one hardware engine; and
        upon completion of the compilation of the component:
            sending the compiled component to one of the hardware engines to be executed by the one hardware engine; and
            monitoring communication so that the one hardware engine can interact with other components in other hardware engines or software engines.

2. The method of claim 1, wherein the hardware compiler places and routes the component.

3. The method of claim 2, wherein the hardware compiler performs a timing analysis of the component after placing and routing the component.

4. The method of claim 1, wherein the hardware compiler generates a bitstream for an FPGA.

5. The method of claim 4, wherein hardware compiler downloads the bitstream into the FPGA after generating the bitstream.

6. The method of claim 1, wherein monitoring the communication includes:
    receiving communications messages from the one hardware engine; and
    posting the communications messages in a communications memory in the runtime.

7. The method of claim 1, wherein the components in the plurality of components are individual components or fused components.

8. A non-transitory computer readable storage medium storing instructions that when executed by one or more processors perform a method for implementing a distributed hardware system, the method comprising:
    retrieving from storage a hardware design described in a hardware description language, wherein the hardware design includes a plurality of components; and
    for each component of the hardware design:
        sending the component to a hardware compiler and to one of a plurality of software engines, wherein the hardware compiler compiles the component to run in one of a plurality of hardware engines and wherein the one software engine simulates the component while the hardware compiler compiles the component for the one hardware engine; and
        upon completion of the compilation of the component:
            sending the compiled component to one of the hardware engines to be executed by the one hardware engine; and
            monitoring communication so that the one hardware engine can interact with other components in other hardware engines or software engines.

9. The non-transitory computer readable storage medium of claim 8, wherein the hardware compiler places and routes the component.

10. The non-transitory computer readable storage medium of claim 9, wherein the hardware compiler performs a timing analysis of the component after placing and routing the component.

11. The non-transitory computer readable storage medium of claim 8, wherein the hardware compiler generates a bitstream for an FPGA.

12. The method of claim 11, wherein hardware compiler downloads the bitstream into the FPGA after generating the bitstream.

13. The non-transitory computer readable storage medium of claim 8, wherein monitoring the communication includes:
receiving communications messages from the one hardware engine; and
posting the communications messages in a communications memory in the runtime.

14. The non-transitory computer readable storage medium of claim 8, wherein the components in the plurality of components are individual components or fused components.

15. A computing system for implementing a distributed hardware system, the system comprising:
a storage storing a hardware design for the distributed hardware system described in a hardware description language;
one or more processors coupled to the storage; and
a memory coupled to the one or more processors and containing runtime software, wherein the runtime, when executed by the one or more processors, carries out the steps of:
retrieving from the storage the hardware design, wherein the hardware design includes a plurality of components; and
for each component of the hardware design:
sending the component to a hardware compiler and to one of a plurality of software engines, wherein the hardware compiler compiles the component to run in one of a plurality of hardware engines and wherein the one software engine simulates the component while the hardware compiler compiles the component for the one hardware engine; and
upon completion of the compilation of the component,
sending the compiled component to one of the hardware engines to be executed by the one hardware engine; and
monitoring communication so that the one hardware engine can interact with other components in other hardware engines or software engines.

16. The computing system of claim 15, wherein the hardware compiler places and routes the component.

17. The computing system of claim 16, wherein the hardware compiler performs a timing analysis of the component after placing and routing the component.

18. The computing system of claim 15, wherein the hardware compiler generates a bitstream for an FPGA.

19. The method of claim 18, wherein hardware compiler downloads the bitstream into the FPGA after generating the bitstream.

20. The computing system of claim 15, wherein monitoring the communication includes
receiving communications messages from the one hardware engine; and
posting the communications messages in a communications memory in the runtime.

* * * * *